(12) United States Patent
Haga

(10) Patent No.: US 6,589,362 B2
(45) Date of Patent: Jul. 8, 2003

(54) ZINC OXIDE SEMICONDUCTOR MEMBER FORMED ON SILICON SUBSTRATE

(75) Inventor: Koichi Haga, Miyagi (JP)

(73) Assignee: Tohoku Techno Arch Co., Ltd. (JP)

( * ) Notice: Subject to any disclaimer, the term of this patent is extended or adjusted under 35 U.S.C. 154(b) by 0 days.

(21) Appl. No.: 09/973,149

(22) Filed: Oct. 9, 2001

(65) Prior Publication Data

US 2003/0015719 A1 Jan. 23, 2003

(30) Foreign Application Priority Data

Jul. 19, 2001 (JP) ........................................ 2001-219280

(51) Int. Cl.[7] .............................................. H01L 29/12
(52) U.S. Cl. ...................... 148/33.4; 257/103; 29/25.01
(58) Field of Search ........................ 148/33.4; 29/25.01

(56) References Cited

U.S. PATENT DOCUMENTS

| | | | |
|---|---|---|---|
| 4,623,426 A | | 11/1986 | Peters |
| 5,852,702 A | * | 12/1998 | Nishida et al. .............. 385/130 |
| 6,291,258 B2 | * | 9/2001 | Kadota .......................... 438/46 |
| 6,358,378 B2 | * | 3/2002 | Choi et al. .............. 204/192.15 |

FOREIGN PATENT DOCUMENTS

| | | |
|---|---|---|
| JP | 57-118002 | 7/1982 |
| JP | 57-123969 | 8/1982 |
| JP | 59-501157 | 7/1984 |
| JP | 2718046 | 8/1989 |
| JP | 06-216699 | 8/1994 |
| JP | 10-022519 | 1/1998 |
| JP | 11-074202 | 3/1999 |
| WO | 84/00178 | 1/1984 |
| WO | 01/73170 | 10/2001 |

OTHER PUBLICATIONS

Kim et al. Photometric, Stoichiometric and Structural Properites of n-ZnO film on p-Si, May 4, 2001, Thin Solid Films, 2001, pp 93-98.*

Gorla, C.R., et al., *Structural, optical, and surface acoustic wave properties of epitaxial ZnO films grown on (0112) sapphire by metalorganic chemical vapor deposition*, Journal of Applied Physics, vol. 85, No. 5, pp. 2595–2602 (03/99).

Emanetoglu, N.W., et al., *Epitaxial Growth and Characterization of High Quality ZnO Films for Surface Acoustic Wave Applications*, IEEE Ultrasonics Symposium, pp. 195–199 (1997).

Sato, H., et al., *Transparent conducting ZnO thin films prepared on low temperature substrates by chemical vapour deposition using $Zn(C_5H_7O_2)_2$*, Thin Solid Films, No. 246, pp. 65–70 (1994).

* cited by examiner

Primary Examiner—Olik Chaudhuri
Assistant Examiner—Douglas A. Wille
(74) Attorney, Agent, or Firm—Thompson Hine LLP

(57) ABSTRACT

The surface of a silicon substrate is covered with a natural oxide film having a thickness of several tens of angstroms. In an initial process, the natural oxide film is removed with hydrogen fluoride (HF) diluted with pure water to 10% (process(1)). The surface of the silicon substrate from which the oxide film has been removed is covered with hydrogen atoms. A large amount of plasma energy is applied to the silicon substrate in a process (2) for depositing a ZnO thin film thereon by sputtering. Hydrogen is dissociated by this energy at low temperature as well as a thin film buffer layer, in which an amorphous material and fine crystals are mixed, is formed by easing the difference of lattice intervals between silicon and zinc oxide. Next, in a process (3), a ZnO thin film of high quality is formed on the buffer layer by MO-CVD using it as a seed crystal. With this arrangement, a zinc oxide semiconductor member suitable for a light receiving element can be formed on a silicon substrate.

9 Claims, 19 Drawing Sheets

Fig. 4
(A) 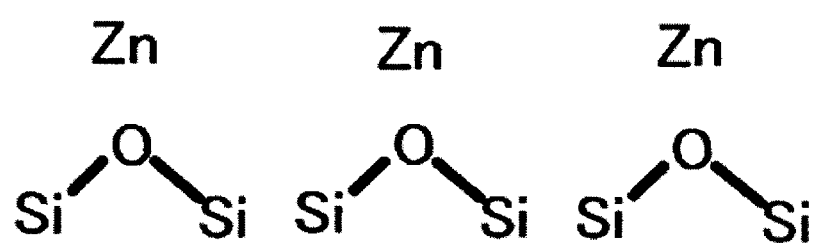
(B) 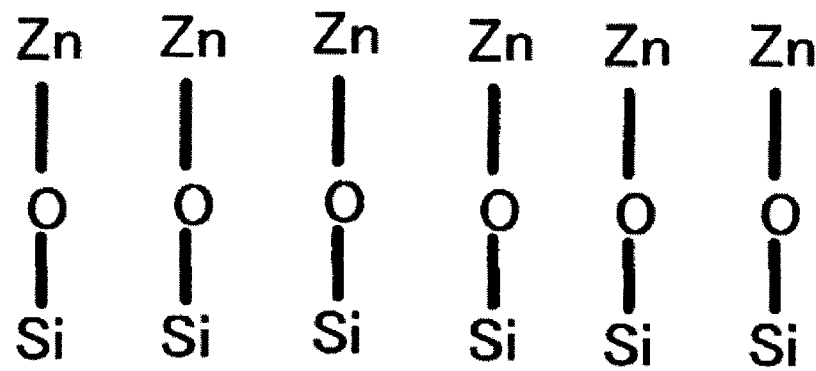

(a)

(b) FORMING CONDITIONS

| SUBSTRATE | p-TYPE Si(111) |
|---|---|
| TREATMENT TIME | 0~30 min |
| SUBSTRATE TEMPERATURE | 250 °C |
| HIGH FREQUENCY POWER | 50 W |
| PRESSURE | 0.01 Torr |
| FLOW RATE OF Ar:$O_2$ | 9 : 1 (Ar+$O_2$=2.0 sccm) |

M: METALLO-CHEMICAL ELEMENT (A)

(B)

| SUBSTRATE | ZnO(SPUTTERING)/p-TYPE Si(111) |
|---|---|
| SUBSTRATE TEMPERATURE | 520 °C |
| TEMPERATURE OF Zn CYLINDER | 85 °C |
| TEMPERATURE (Tc) OF Ga CYLINDER | 65~90°C |
| TREATMENT TIME | 60 min |
| FLOW RATE OF $N_2$ IN Zn CYLINDER | 100 sccm |
| FLOW RATE OF $N_2$ IN Ga CYLINDER | 50 sccm |
| FLOW RATE OF $O_2$ | 300 sccm |
| PRESSURE | $1.3 \times 10^4$ Pa |

Fig. 17
(a) BAND VIEW
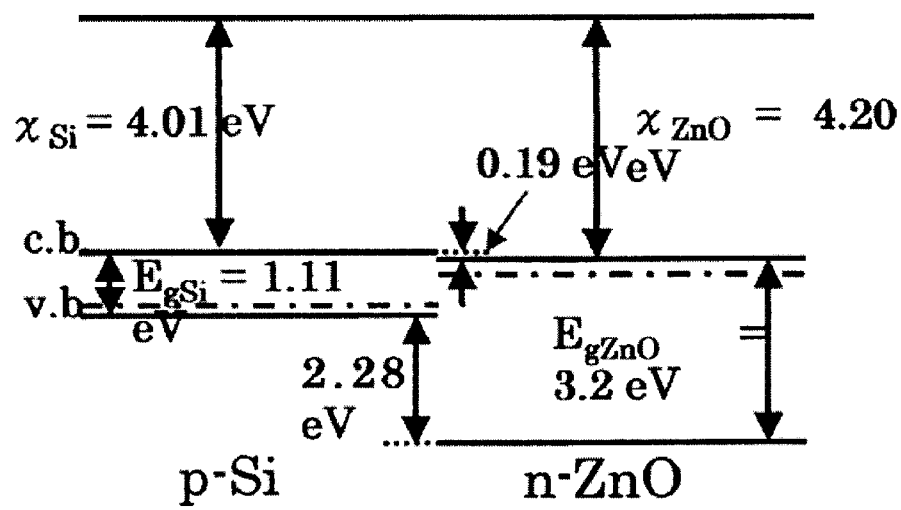
(b) JUST AFTER Pn JUNCTION
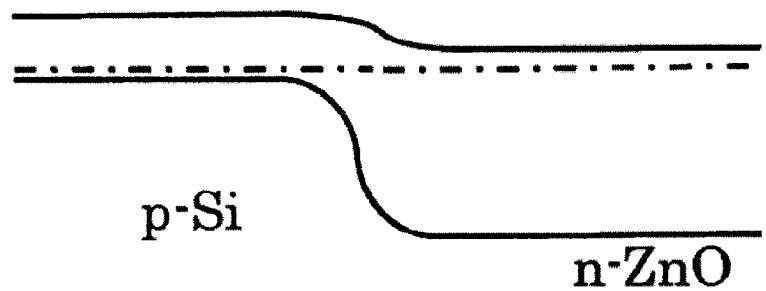
(c) AFTER APPLICATION OF FORWARD BIAS
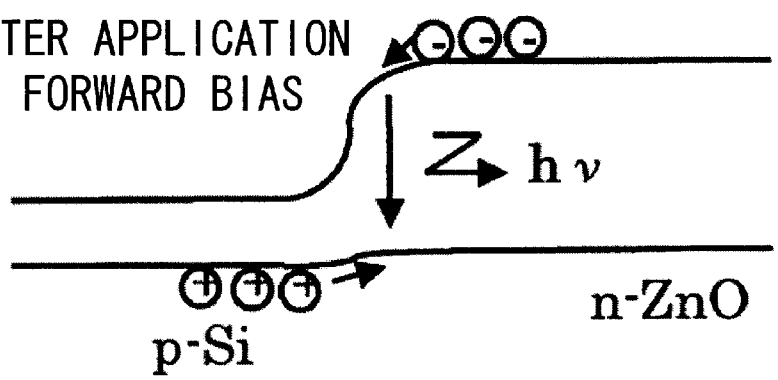

ZINC OXIDE SEMICONDUCTOR MEMBER FORMED ON SILICON SUBSTRATE

CROSS REFERENCE TO RELATED APPLICATIONS

This application claims priority under 35 U.S.C. §119 to Japanese Patent Application No. 2001-219280 filed on Jul. 19, 2001.

BACKGROUND OF THE INVENTION

1. Field of the Invention

The present invention relates to a zinc oxide polycrystal thin film semiconductor member formed on a silicon substrate, and more particularly, to a semiconductor member ideal as a light emitting element.

2. Description of the Related Art

Recently, it is expected to apply a zinc oxide (ZnO) thin film to a transparent conductive film, a surface elastic wave device, a near-ultraviolet emitting element, and the like. In particular, a single crystal ZnO thin film grown on a single crystal sapphire substrate hetero-epitaxially exhibits excellent electric/optical characteristics, and the application thereof to various devices is positively proceeded. However, the employment of the expensive sapphire substrate makes it non-realistic to apply the thin film to a device requiring a large area. If the ZnO thin film can be grown on a silicon substrate in place of the sapphire substrate, it is possible to make a novel electronic device by combining an ultra-micro processing technology for silicon with the physical properties of the ZnO thin film such as piezoelectricity, ferroelectricity, near-ultraviolet emission, and the like, in addition to the cost reduction of the device.

Hitherto, when it is intended to grow a ZnO thin film on a silicon substrate hetero-epitaxially, a natural oxide film ($SiO_2$) on the surface of the silicon substrate prevents the epitaxial growth of the ZnO thin film. In addition, it is difficult to form a single crystal ZnO thin film of good quality due to an adverse affect such as the reduction of crystallinity that is caused by the difference of the lattice constant.

Similarly, in the study of superconducting oxides, there is almost no example in which a single crystal superconducting material was grown on a silicon substrate epitaxially. In contrast, many reports describe that CaAs, SiC, and the like were grown on a silicon substrate epitaxially, and most of these reports describe that thin films were grown under an ultra-vacuum environment. An amorphous oxide film is formed on a silicon substrate. Thus, unless it is removed, epitaxial growth reflecting the crystallinity of the substrate cannot be performed.

An ordinary method of removing an oxide film is to sublimate it by heating a substrate to at least 1000° C. in an ultra-vacuum environment. Unless this method is performed in an ultra-vacuum of at least $10^{-8}$ Torr, the clean surface of a silicon substrate becomes polluted with oxygen atoms slightly existing in a vacuum environment and the surface of the substrate is oxidized again. Another method of removing the oxide film is to form a clean surface on a substrate by etching the surface of the substrate with hydrogen fluoride, preventing the oxidation of the surface by bonding hydrogen to the resultant clean surface, and removing the hydrogen from the surface by heat of several hundreds of degrees. However, it is also difficult to perform this method in an environment other than an ultra-vacuum environment.

From the reasons described above, in an oxide thin film forming method of forming a thin film by supplying oxygen gas to a silicon substrate the surface of which is made clean, it is apparent that amorphous oxide covers the surface of the silicon substrate and makes epitaxial growth difficult.

A method of forming an zinc oxide thin film on a silicon substrate was reported first by M. Shimizu et al in a report "Growth of c-Axis Oriented ZnO Thin Films with High Deposition Rate on Silicon by CVD Method" (Journal of Crystal Growth 57 (1982) 94–100). In this report, a zinc oxide (ZnO) thin film was grown on a silicon substrate by means of chemical vapor deposition (CVD). In this method, an n-type zinc oxide was formed on a substrate having a p-type silicon (111) surface so as to make a pn-junction device. The thus obtained ZnO thin film could secure a rectifying property as an electric characteristic and was excellent in crystallinity, in addition to the rectifying property. As shown in FIG. 1, however, in photoluminescence (PL) characteristics obtained by He—Cd laser, emission of visual light is dominant and light emission in the vicinity of 380 nm that corresponds to the forbidden band width of a ZnO thin film cannot be confirmed at all. Light emission in the vicinity of 380 nm performed by photoluminescence is an important factor for determining whether or not impurities exist in a forbidden band, the composition in a thin film, and whether a structure is good or bad. When the emission of visual light is dominant in photoluminescence as shown in FIG. 1, it suggests that a defect level exists in a forbidden band due to impurities, a defective structure, an abnormal composition, and the like, which is a serious problem when the ZnO thin film is applied to a light emitting element, and the like.

Recently, a method of forming a ZnO thin film on a silicon substrate was found by A. Miyake et al (refer to "Growth of Epitaxial ZnO Thin Film by Oxidation of Epitaxial ZnS Film on Si (111) Substrate" (Jpn. J. Appl. Phys. 39 (2000) L1186). In this method, a ZnO thin film was formed by forming zinc sulfide (ZnS) on a silicon substrate and annealing the zinc sulfide in oxygen. A result obtained could be satisfied in a certain degree as to all of crystallinity, composition, photoluminescence characteristics. In particular, the photoluminescence characteristics were such that light emission corresponding to a forbidden band width also could be confirmed while light emission in a visible light region also was observed. Although it is conceived from the above result that this method of creation can be sufficiently satisfied, it becomes apparent that it is difficult to add p- and n-type impurities. It is conventionally conceived difficult to add p- and n-type impurities to a ZnS thin film, and it is needless to say that the addition of the impurities is difficult even if the ZnS thin film is oxidized. Further, it is reported in many papers in the past that p- and n-type impurities must be added to a compound of Group II–VI in a thermal non-equilibrium state. It is conceived difficult to add impurities b the method of A. Miyake et al because a ZnO thin film is formed by thermally oxidizing it at high temperature.

As described above, it is very difficult to form a zinc oxide thin film on a silicon film. A greatest cause of it resides in that a silicon oxide film that is stably formed on a silicon substrate is amorphous. To epitaxially grow other material on a silicon substrate, first, the bonding hands of silicon atoms must chemically bond to the bonding hands of a material to be deposited. Next, it is necessary that the lattice intervals of of these elements be offset a few percentages.

The amorphous silicon oxide film acts as an obstacle to satisfy the above conditions. As described above, many research and development facilities have tried to develop a technology for removing a silicon oxide film from a silicon substrate and for epitaxially growing other material on the resultant surface of the silicon substrate. However, it is very difficult to develop a technology for growing an oxide thin film after silicon oxide is removed, and even if epitaxial growth can be performed unexpectedly, it is difficult to grow an oxide thin film with good reproducibility.

SUMMARY OF THE INVENTION

Accordingly, an object of the present invention is to form a polycrystal zinc oxide semiconductor member that is excellent in crystallinity and in composition on a silicon substrate. It is another object of the present invention to add n-type impurities to a thin film formed, to obtain a pn-junction device making use of the a p-type silicon substrate and an n-type ZnO thin film and to arrange the pn-junction device as a light receiving element and a light emitting element.

To achieve the above objects, a zinc oxide semiconductor member of the present invention includes a zinc oxide thin film formed on a substrate having a single crystal silicon surface, wherein the crystal orientation of the surface of the zinc oxide thin film exhibits the c-axis orientation surface of a wurtzite structure, and photoluminescence spectrum when He—Cd laser (325 nm) is irradiated to the zinc oxide thin film emits light in the vicinity of a forbidden band width in the vicinity of 387 nm.

The zinc oxide thin film may be oriented only to the c-axis of a zinc oxide crystal (002) surface on a silicon substrate surface (111) and may include a zinc oxide buffer layer, and the crystal surface on the buffer layer may rotate 30°.

After hydrogen is bonded to the surface of the substrate having the single crystal silicon surface by a hydrogen fluoride treatment, a buffer layer may be formed on the substrate by depositing zinc oxide thereon by sputtering, and a zinc oxide thin film may be formed on the buffer layer by depositing zinc oxide thereon by chemical vapor deposition using acetylacetone zinc.

A pn-junction light receiving element may be constructed by constructing a pn junction device the spectral sensitivity of which is higher in a near violet region than in a visible light region by arranging the silicon substrate as a p-type and the zinc oxide semiconductor member as an n-type. Further a pn-junction light emitting element may be constructed the wavelength of light emitted thereby is changed by an increase in an injected current in a forward bias state in which the p-type silicon substrate of the pn-junction device is set to a positive potential and the zinc oxide semiconductor member is set to a negative potential.

As a light emitting element, a hole insertion layer may be inserted into the interface of junction between the p-type silicon substrate and the n-type zinc oxide semiconductor member from the p-type silicon substrate.

Further, the present invention also includes a method of manufacturing the semiconductor member and the elements. The manufacturing method includes the steps of bonding hydrogen on the surface of the single crystal silicon substrate by a hydrogen fluoride treatment, depositing, after the hydrogen fluoride treatment, zinc oxide on the single crystal silicon substrate by sputtering, and depositing a zinc oxide thin film on the deposited zinc oxide by chemical vapor deposition using acetylacetone zinc.

When the single crystal silicon substrate is formed as a p-type and the zinc oxide thin film is formed as an n-type, at least one of acetylacetone metals of Group III is used as a impurity material for forming the zinc oxide thin film as the n-type.

BRIEF DESCRIPTION OF THE DRAWINGS

FIG. 4A shows a state in which the surface of a silicon substrate (111) is oxidized, and FIG. 4B shows the structure of a silicon substrate at an initial step at which the c-axis of a ZnO thin film is formed on the silicon substrate;

FIGS. 17A, 17B, and 17C are band views showing a pn-junction device formed by combining an n-type ZnO thin film with a p-type silicon substrate;

DESCRIPTION OF THE PREFERRED EMBODIMENTS

An embodiment of the present invention will be described below in detail with reference to the drawings.

In the present invention, a ZnO thin film can be formed on a silicon substrate with good reproducibility as a result of several try and error processes. These processes will be described below.

Figure 1:
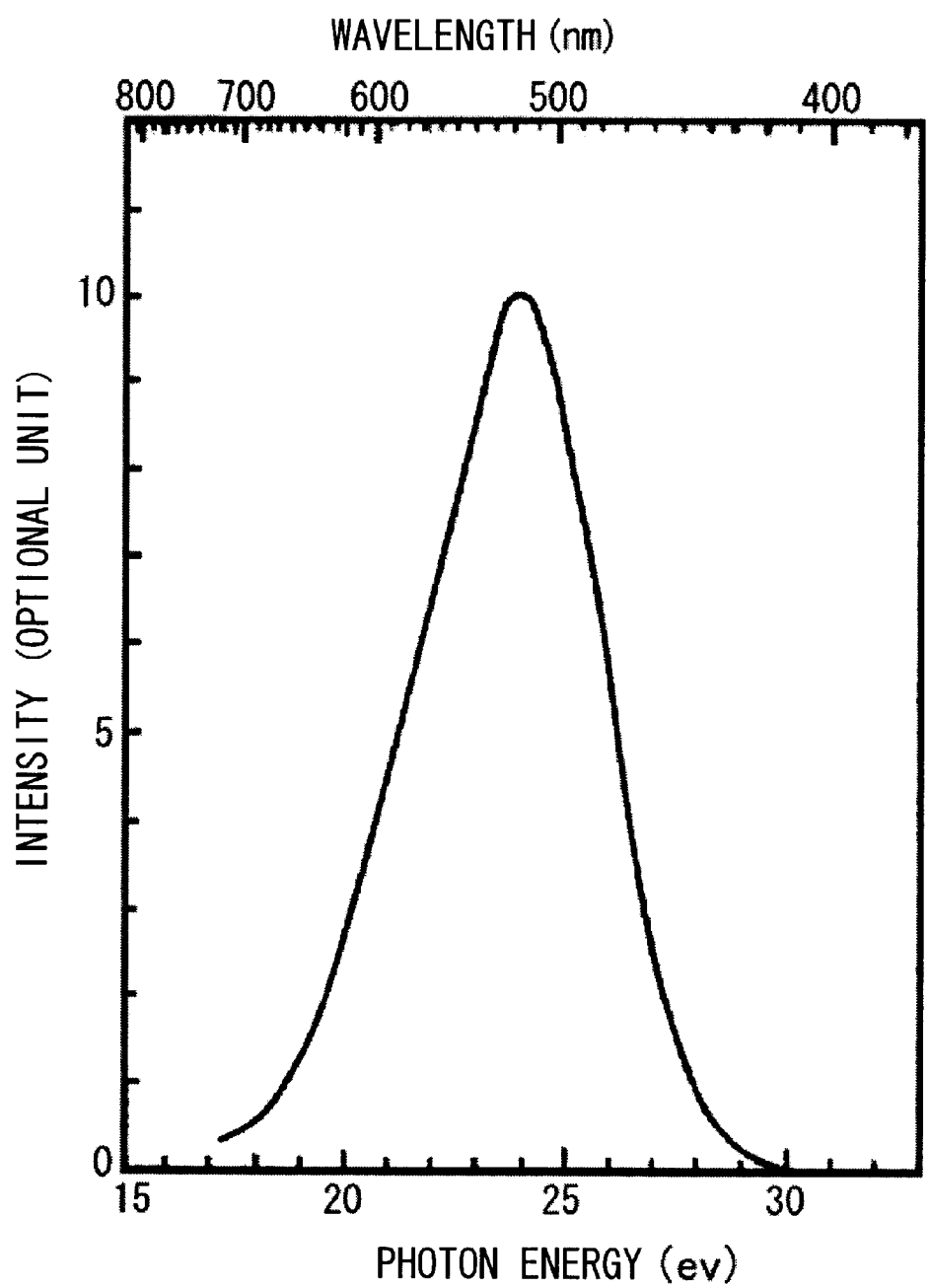
FIG. 1 is a graph showing the photoluminescence characteristics of a zinc oxide thin film formed on a conventional silicon substrate.
Figure 2:
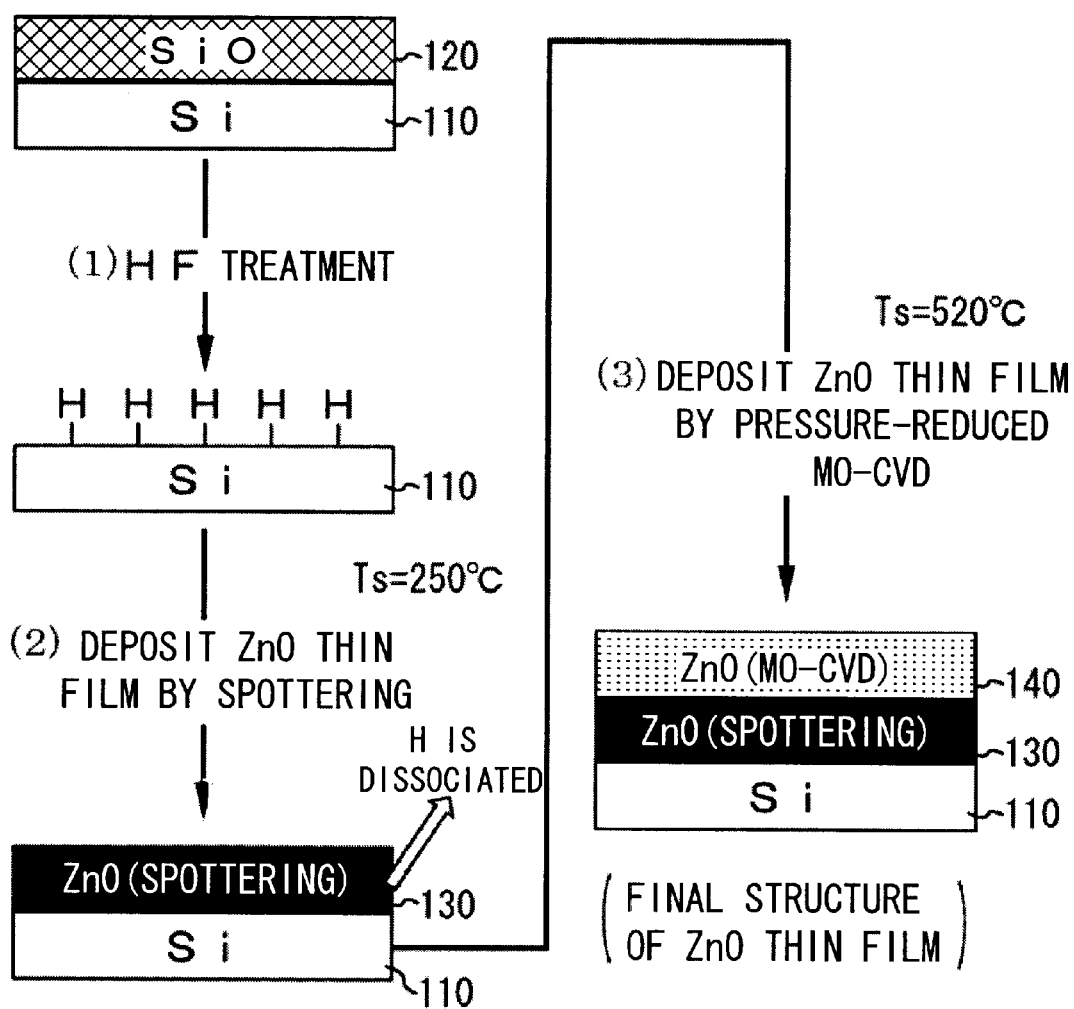
FIG. 2 is a view showing the steps for forming a zinc oxide thin film on a silicon substrate of the present invention.

FIG. 2 summarizes these processes. In FIG. 2, the surface of a silicon substrate 110 is covered with a natural oxide film 120 having a thickness of several tens of angstroms. In an initial process, the natural oxide film 120 is removed with hydrogen fluoride (HF) diluted with pure water to 10% (refer to FIG. 2(1)). The surface of the silicon substrate 110 from which the oxide film has been removed is covered with hydrogen atoms.

Figure 3:
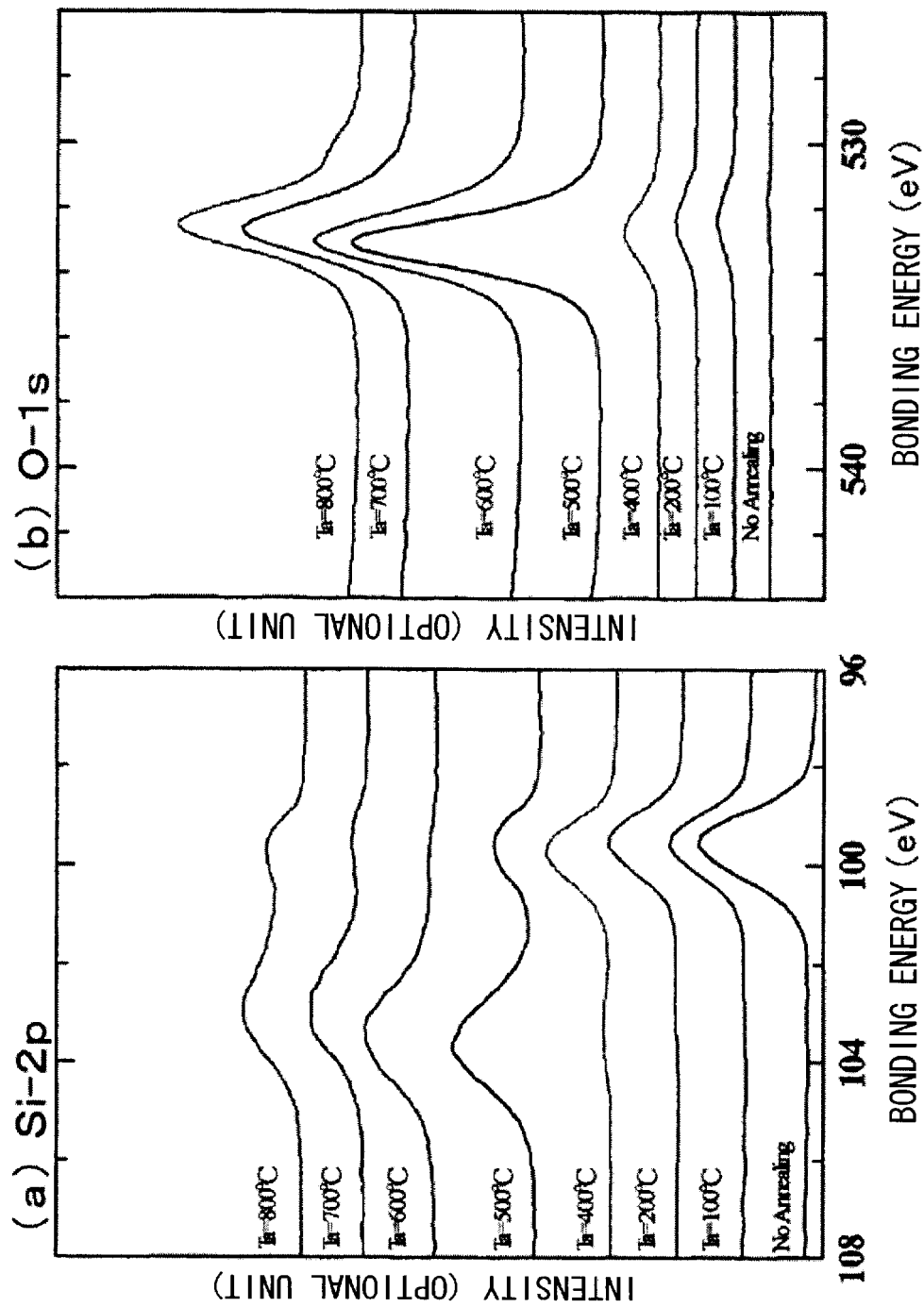
FIGS. 3A and 3B are views showing spectra when the state of the surface of a silicon substrate covered with hydrogen atoms was measured by X-ray photoelectron spectroscopy (XPS)

The state of the surface of the silicon substrate covered with the hydrogen atoms is measured with X-ray photoelectron spectroscopy (XPS), and FIG. 3 shows the spectra thereof measured by it. FIG. 3 also shows the relationship between the change of heating temperature and the XPS spectra in order to confirm the heating temperature at which hydrogen that has terminated the silicon atoms on the surface of the silicon substrate is removed in a vacuum of about $10^{-6}$ Torr. FIG. 3 shows the result of XPS spectra of Si-2p (FIG. 3A) and O-1s (FIG. 3B).

In the spectra of the Si-2p shown in FIG. 3A, the peaks of XPS spectra of only Si are shown at a bonding energy of 99.5 eV, whereas the peaks of XPS spectra of $SiO_x$ are shown at bonding energy greater than 99.5 eV. In the spectra of the O-1s shown in FIG. 3B, the peaks of XPS spectra corresponding to the O-1s are observed in the vicinity of 533 eV. No peak corresponding to the bonding energy of $SiO_x$ and O-1s is observed in a specimen (shown as "No Annealing") which is held at an ordinary temperature after it has been subjected to a HF treatment, from which it can be found that the oxide film on the surface of the silicon substrate was removed by the HF treatment. However, as a heat treatment temperature rises, the values of peaks of the Si-2p decreases in the vicinity of the bonding energy of 99.5 eV, and the values of peaks of the O-1s also begin to gradually increase. At a heating temperature of 500° C. a peak appears at the bonding energy of 104 eV due to the oxidation of Si, and the values of peaks of the O-1s also greatly increase. When the heating temperature is further increased, a silicon oxide film evaporates again from the surface of the silicon substrate, whereby the peaks of spectra at the bonding energy of 104 eV shift to a low energy side, and the values of the peaks of the Si-2p begin to increase again. It is contemplated that a reason why the surface of the silicon substrate is oxidized when it is heated in a vacuum is that hydrogen is removed from the surface of the silicon substrate at a heating temperature of 500° C. and the active surface from which the hydrogen is removed bonds to a minute amount of oxygen contained in a vacuum vessel. When the silicon substrate is further heated to 600° C., almost all the hydrogen on the surface thereof is removed and the surface of the silicon substrate is perfectly oxidized with the Si bonding hands on the surface bonding to oxygen.

From the result described above, it can be understood that the HF treatment is a very effective means for removing the oxide film on the surface of a silicon substrate. However, in the sputtering process used to form a buffer layer in the present invention, when a degree of vacuum of $10^{-3}$ Torr at the highest and the result of heating shown in FIG. 3 are taken into consideration, oxidation is started at a heating temperature of at least 200° C.

Figure 5:
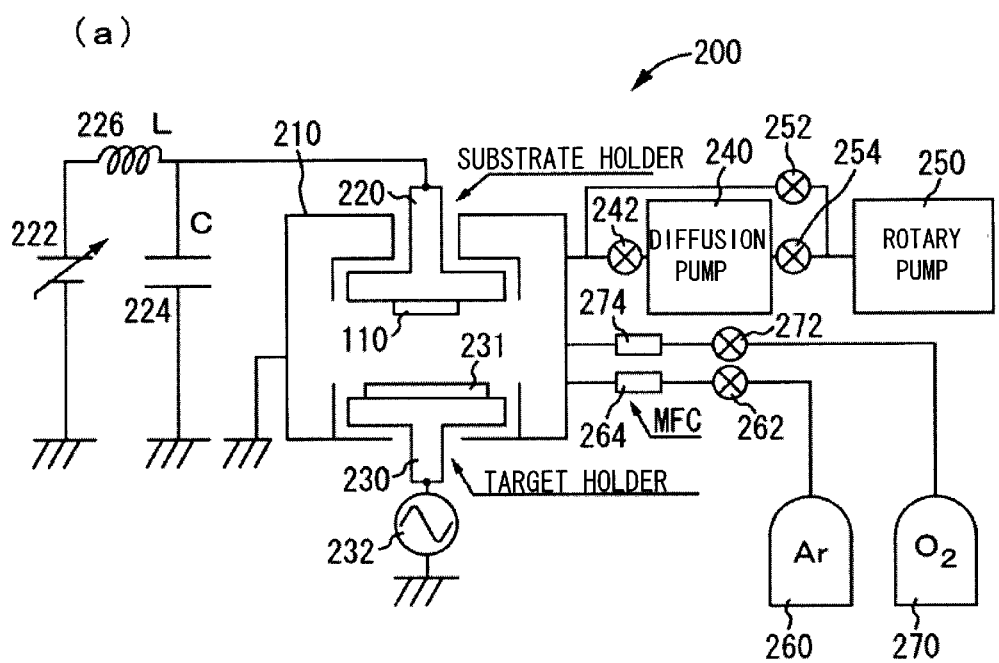
FIG. 5A is a schematic view of a sputtering apparatus used to form a buffer layer.
FIG. 5B is a table showing conditions under which the buffer layer is formed.
Figure 6:
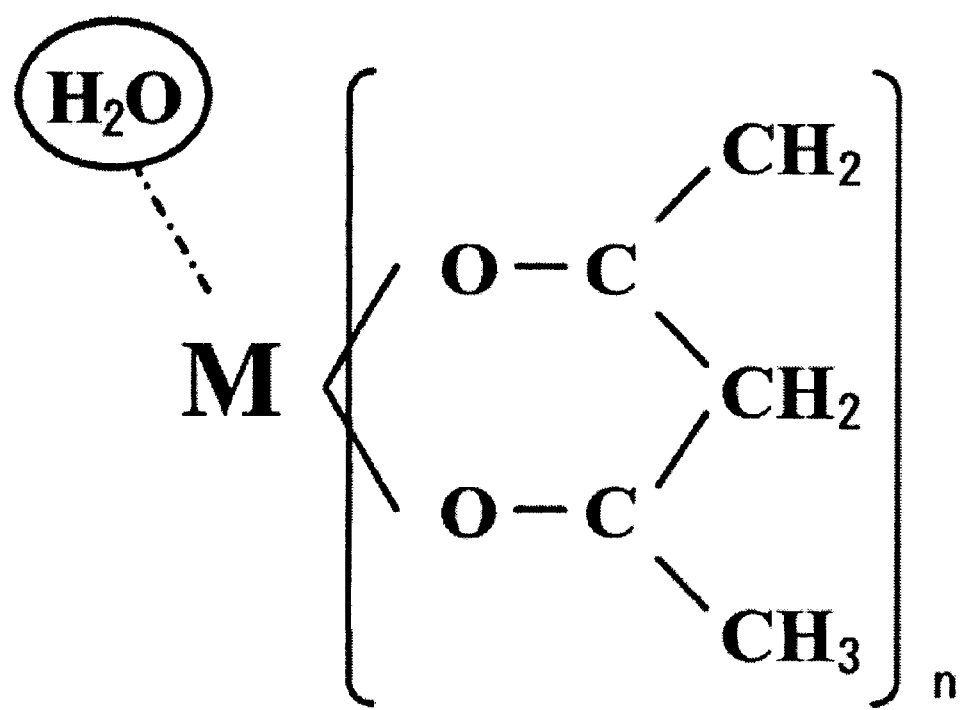
FIG. 6 is a view showing acetylacetone metal to which water molecules bond as hydrate.

What is meant by that epitaxial growth is obstructed in an oxidation process is as described below. FIG. 4A shows a state in which a Si (111) surface is oxidized. The bonding hands of silicon atoms on the surface cannot bond to external Zn due to the existence of oxygen atoms. A large amount of plasma energy is applied in a process for depositing a ZnO thin film by sputtering. Hydrogen is dissociated by this energy at low temperature, further the creation of the bonding state shown in FIG. 4A is prevented, and the structure shown in FIG. 4B is grown in which zinc atoms are bonded, the structure being in the initial process of a laminated structure in which the c-axis of a ZnO thin film grows. However, there is a problem in that the Si (111) surface and a ZnO (002) surface have several tens percentage of lattice mismatch which is the difference of lattice intervals that is not suitable to epitaxial growth. What eases the difference of the lattice intervals is a thin film buffer layer 130 which is formed by sputtering at a low temperature of 250° C. (refer to FIG. 2(2)) and in which an amorphous material and fine crystals are mixed. This buffer layer 130 has a very flexible crystal structure while the crystallinity thereof is bad. FIG. 5A shows a schematic view of a sputtering apparatus used to form the buffer layer, and FIG. 5B shows an example of conditions under which the buffer layer is formed.

In the sputtering apparatus 200 shown in FIG. 5A, a zinc oxide 231 is placed in the target holder of a growing chamber 210, and the silicon substrate 110 is placed on a substrate holder 220. The interior of the growing chamber 210 is kept to a pressure of, for example, about 0.01 Torr by a diffusion pump 240 and a rotary pump 250, and argon gas and oxygen gas are supplied into the growing chamber 210 while controlling it by mass flow controllers (MFC) 264 and 274. The argon gas is made to a plasma state by the high frequency supplied from a high frequency oscillator 232 and collided against the zinc oxide 231 so as to spring out zinc oxide atoms. These zinc oxide atoms deposit on the silicon substrate 110, whereby the buffer layer 130 is formed. At this time, the zinc oxide atoms bond to silicon atoms and form the bonding-structure shown in FIG. 4B. It is found that when only argon gas is used in the formation of the buffer layer, oxygen lacks somewhat. Thus, oxygen gas also is supplied in addition to the argon gas. The ratio of argon gas to oxygen gas is, for example, 9:1 (the amount of argon gas and oxygen gas is 2.0 sccm in total).

Next, the buffer layer 130 is used as a seed crystal, and a ZnO thin film 140 of high quality is grown on the buffer layer 130 by MO-CVD (refer to FIG. 2(3)). The formation of the ZnO thin film 140 has originality of the present invention as to a material, a forming method, and the like. First, acetylacetone zinc ($Zn(acac)_2$) which is one of the organic metals of β diketone compound, is used as the material. This material is commercially available as a reagent and ordinarily has purity of 99.8% to 99.99%. There are two types of $Zn(acac)_2$, that is, $Zn(acac)_2(H_2O)$ in which water molecules bond to a zinc element as hydrate and $Zn(acac)_2$ of non-hydrate. The reagent does not have any description for discriminating them and is put on the market with hydrate and non-hydrate contained therein in mixture. $Zn(acac)_2(H_2O)$ is composed of one hydrate in which one water molecule is bonded in a refining process, and this is most stable hydrate. In the present invention, hydrate and non-hydrate are used as a material in a state in which they are not mixed with each other. Differential thermal analysis (DTA) and thermogravimetry (TG) are used to evaluate a hydrate material and a non-hydrate material. The differential thermal analysis measures an endothermic reaction or an exothermic reaction when the structure of a material changes. The thermogravimetry measures a change of weight when a material sublimates or evaporates. While the change of weight exhibits a different value in correspondence to a heating speed, the endothermic and exothermic reactions have a value which is inherent to a material. The measuring conditions for DAT and TG are set such that a temperature increasing speed is 10° C./min and the flow rate of $N_2$ gas is set to 200 cc/min in an atmospheric pressure.

Figure 7:
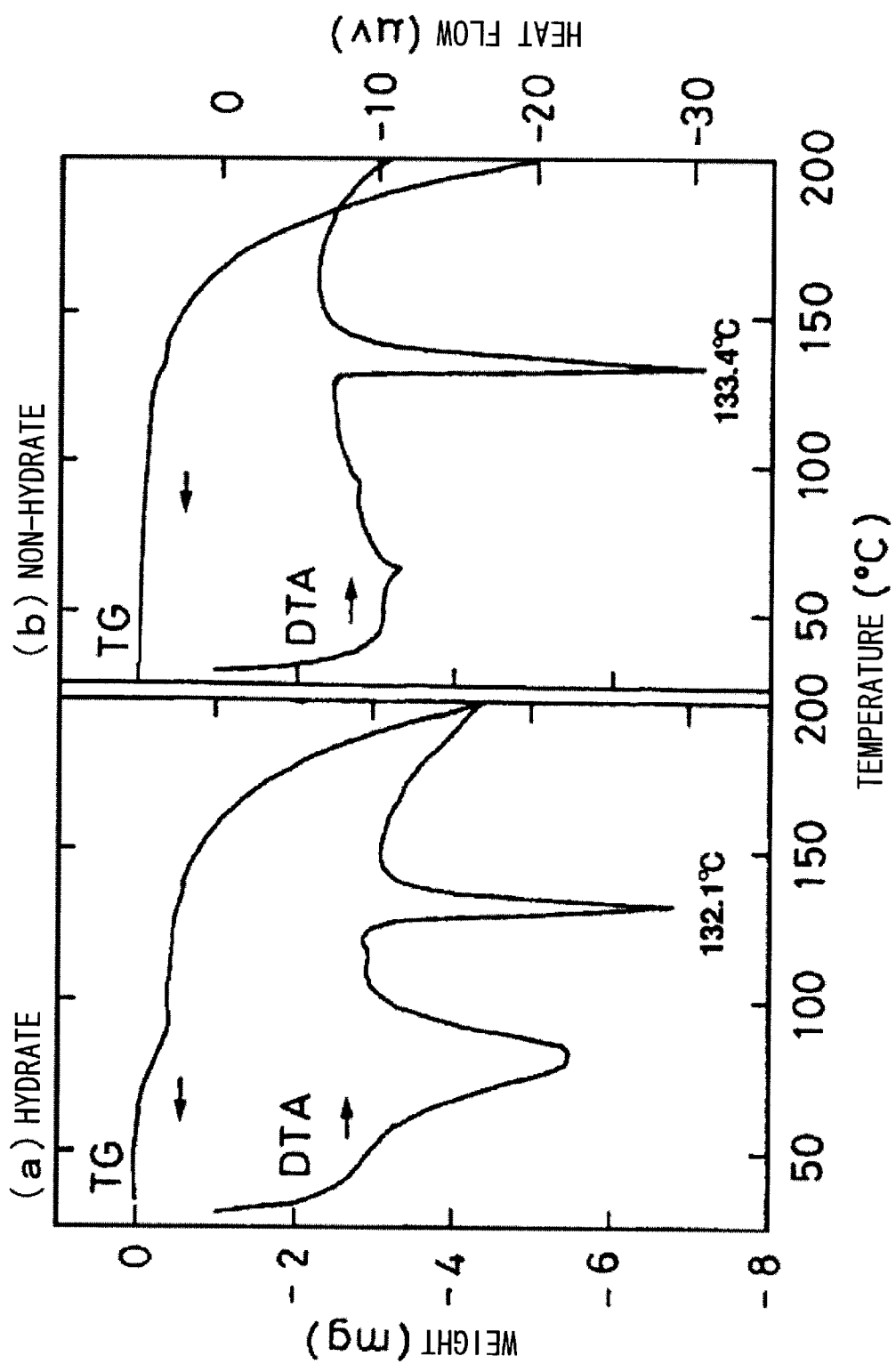
FIGS. 7A and 7B are graphs showing results of measurement of a hydrate material (A) of Zn $(acac)_2$ and a non-hydrate material (B) thereof measured with TG and DTA.

FIGS. 7A and 7B shows the result of measurement of a hydrate material of $Zn(acac)_2$ (A) and a non-hydrate material thereof (B) measured by TG and DTA. In a TG curve shown in FIG. 7A, a weight begins to gradually reduce from the vicinity of 50° C., and a DTA curve also exhibits a large amount of endothermic reaction. It is contemplated this is because that water molecules bonding to the Zn atoms of the $Zn(acac)_2$ material as hydrate gradually evaporate as a temperature rises. When the material is further heated, the weight greatly reduces abruptly from the vicinity of the peak of melt (132.1° C.) of the DTA curve. The TG curve of the non-hydrate material (B) uniformly reduces from the vicinity of 60° C. and abruptly reduces from the vicinity of a peak of melt (133.4° C.) which is slightly higher than that of the hydrate. From a viewpoint of crystallinity and reproducibility, it is preferable to use hydrate rather than non-hydrate in the formation of a thin film. The mixed use of hydrate and non-hydrate obstructs the formation of a thin film of high quality. Further, a melting temperature also is important to create a ZnO thin film of high quality. It is preferable to set the melting temperature to the range of from 132° C. to 135° C. FIG. 8A shows a schematic view of a pressure-reduced metal-organic chemical vapor deposition (MO-CVD) apparatus used to form a ZnO thin film, and FIG. 8B shows an example of conditions under which the ZnO thin film is formed.

Conventionally, a ZnO thin film was formed using atmospheric pressure MO-CVD which could easily shift to industrial mass production (refer to "Hetero-Epitaxial Growth of ZnO Thin Films by Atmospheric Pressure CVD Method" (J. Cryst. Growth 221 (2000) 431). However, this method faced a problem that a material was melted by a change of the sublimation point of the material that corresponded to a slight change of the structure of the material, while the method was less expensive. In the CVD used for solid material, it is not preferable that a material melt. The melt of the material can be prevented by precisely managing the composition, structure, and sublimation cylinder temperature thereof. However, it is difficult to perform this management in the level of quality of a material that is ordinarily put on the market. Another method of preventing the occurrence of this problem is to employ pressure-reduced CVD capable of lowering the sublimation point of a material. In this method, the reaction chamber of a CVD apparatus is evacuated to several tens of Torr by a vacuum pump, and a ZnO thin film is deposited on a material by thermal cracking. This method can reduce the temperature of a material cylinder about 50° C. even if an amount of sublimation is the same, whereby the melt of the material can be prevented.

In a pressure-reduced metal-organic chemical vapor deposition apparatus 300 shown in FIG. 8A, a heatable glass cylinder 324 is filled with $Zn(acac)_2$ as a material. A material, which has purity of 99.99% and the structural stability of which is confirmed by thermal analysis, is used as the above material. The material is sublimated in a heating furnace and then transported into a reaction chamber 360, where a thin film is deposited, by a carrier gas of nitrogen ($N_2$) the flow rate of which is controlled with a flow meter (FM) 354. Further, oxygen gas ($O_2$) acting as a material of oxygen is separately transported through a glass tube until it reaches just before a substrate on which a thin film is deposited to prevent the chemical vapor reaction thereof to the material.

Since $Zn(acac)_2$ is less reactive to $O_2$ gas, pure water must be used as a material for supplying oxygen. It is well known, however, that when pure water is used as the material in a pressure-reduced CVD process, water condensed to piping and the low temperature region of an apparatus evaporates again as an environmental temperature rises and makes it difficult to obtain the reproducibility of the composition of a thin film. There is a large possibility that this obstructs an industrial manufacturing process. In the apparatus 300 shown in FIG. 8A, a preliminary heating region 374 is disposed just before the reaction chamber to supplement the low chemical reactivity of $Zn(acac)_2$ to the $O_2$ gas so as to accelerate the cracking thereof.

In the apparatus 300 shown in FIG. 8A, while an acetylacetone metal of Ga which is accommodated in a heatable cylinder 322 is used as a n-type doping material, acetylacetone metals of B, In, Al, and the like that are the compounds of Group III or dipivaloylmethanato (DPM) metal may be used.

Figure 9:
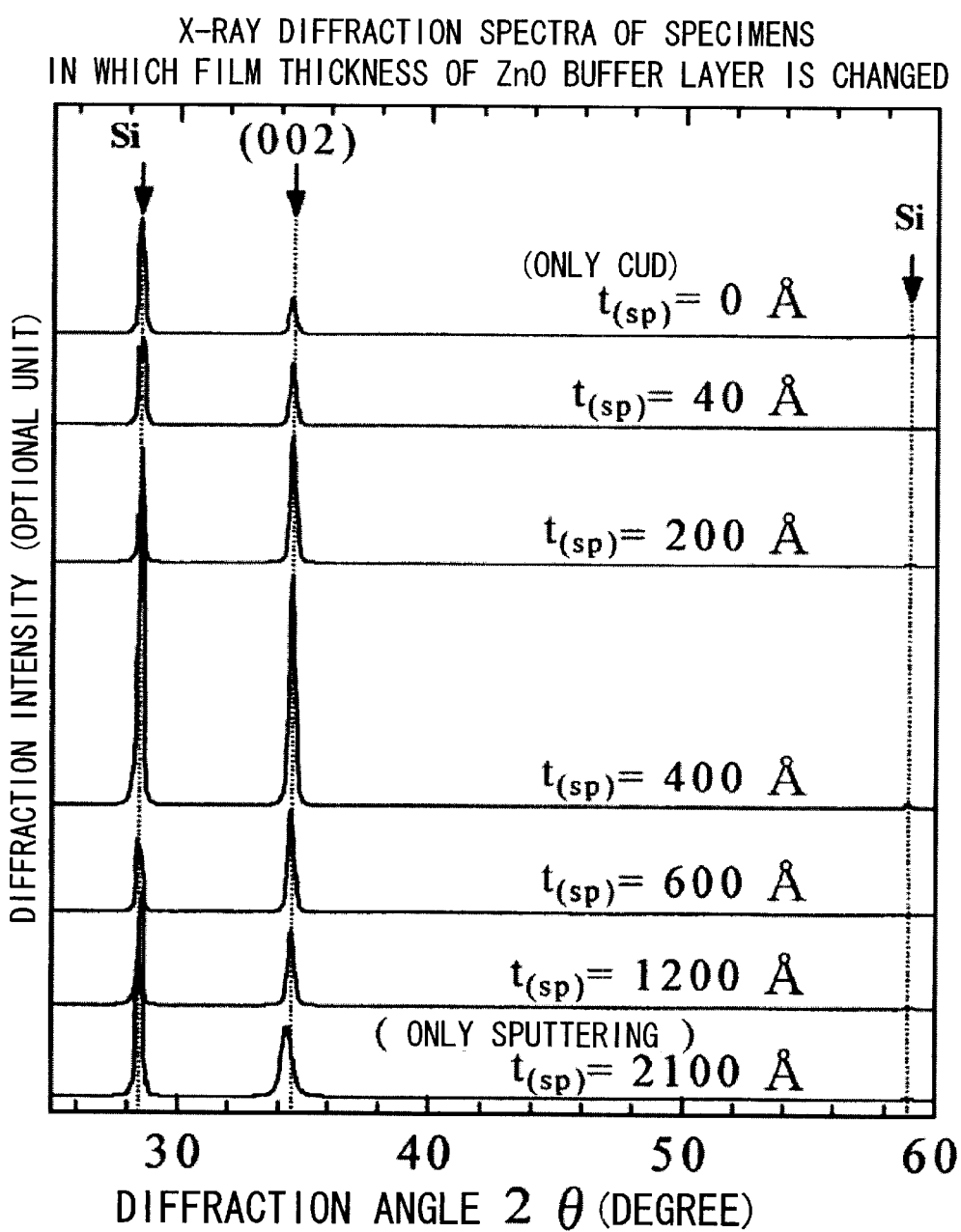
FIG. 9 is a view showing X-ray diffraction spectra when the film thickness of a ZnO buffer layer is changed.
Figure 10:
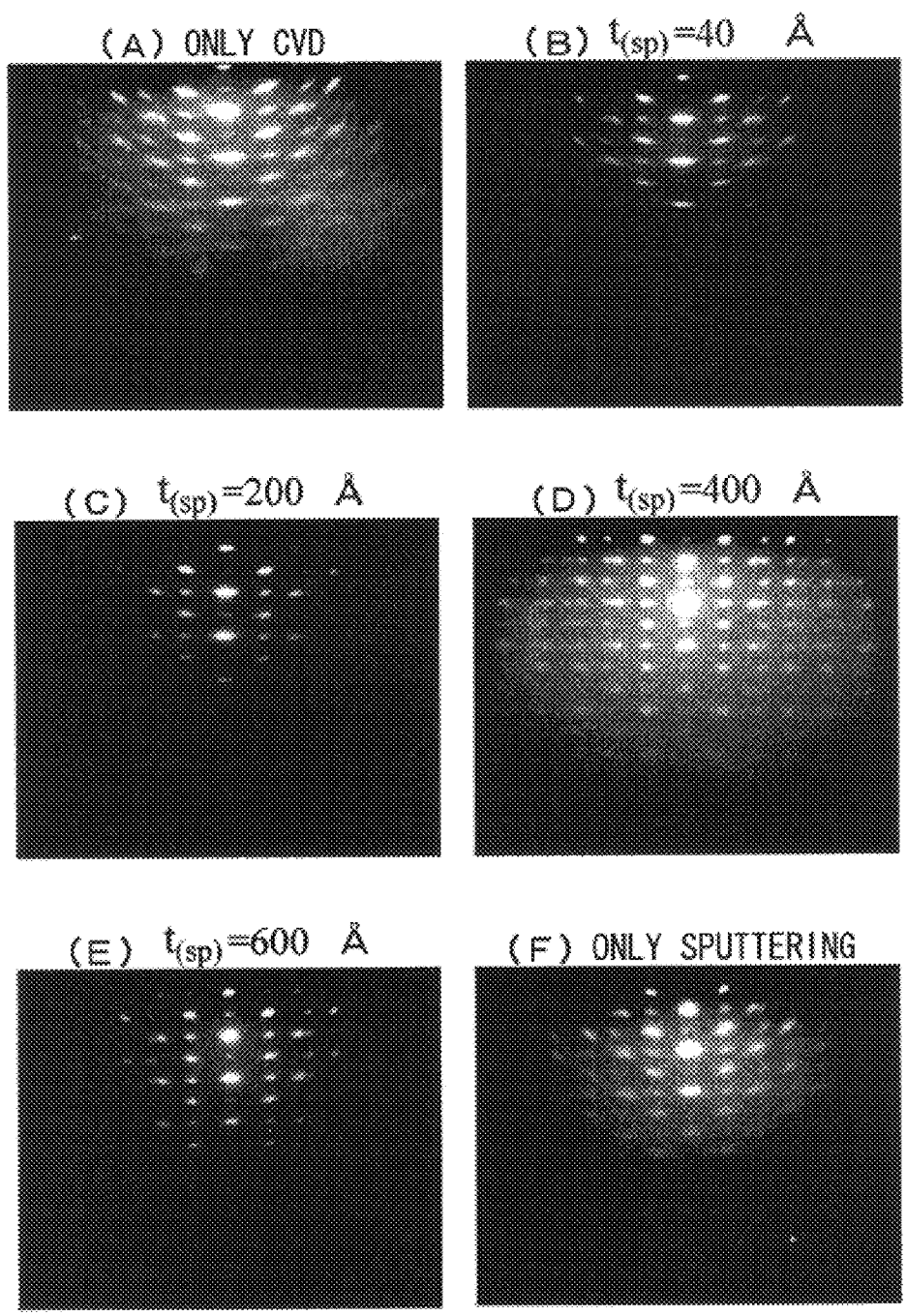
FIGS. 10A, 10B, 10C, 10D, 10E, and 10F are views showing the electron beam diffraction patterns of a ZnO thin film obtained using a high speed reflection high energy electron diffraction (RHEED) apparatus.

FIG. 9 shows X-ray diffraction spectra of the ZnO buffer layer when the film thickness thereof is changed by sputtering in the final structure of the ZnO thin film shown in FIG. 2. Note that these spectra are standardized according to a film thickness. As comparison, FIG. 9 also shows spectra of a ZnO thin film formed only by sputtering and spectra of a ZnO thin film formed only by pressure-reduced MO-CVD. As apparent from FIG. 9, it can be found that a specimen having no ZnO layer formed by sputtering, that is, the specimen formed only by MO-CVD ($t_{(sp)}$=0) has the lowest diffraction intensity of ZnO (002) and that the diffraction intensity of Zn(002) of a specimen having only a ZnO thin film formed by sputtering also is not so high. However, when the thickness of a ZnO layer of a specimen formed by sputtering is set to 400 Å, the specimen has the highest diffraction intensity, and the half-value width of the specimen has a very narrow value of about 0.26. It can be found from the above-mentioned that the introduction of the ZnO buffer layer is a very effective means in the formation of a ZnO thin film of high quality on a silicon substrate.

FIGS. 10A, 10B, 10C, 10D, 10E, and 10F show electron beam diffraction patterns created by means of a high speed reflection high energy electron diffraction (RHEED) apparatus. Conventionally, crystallinity is evaluated only by X-ray diffraction in many cases. However, it is difficult for the X-ray diffraction to evaluate the in-plane rotation of the crystal surface on the surface of a thin film, and further it is also difficult for the X-ray diffraction to evaluate the crystallinity of a polycrystal thin film and a single crystal thin film that are excellent in orientation. When the image of the surface of a crystal formed by electron diffraction is observed by RHEED, the quality of the crystal, the roughness of the surface thereof, and the in-plane rotation of a crystal axis can be made distinct. Debye-ring, which appears in a polycrystal of bad quality and in an amorphous material, can be confirmed in the RHEED images of a specimen created only by CVD (refer to FIG. 10A) and a specimen composed of only a ZnO buffer layer created by sputtering (refer to FIG. 10F). However, when the thickness of the ZnO buffer layer formed by sputtering is set to 400 Å, RHEED spots are linearly arranged in a good order, and the result of it is in good agreement with the result of the above X-ray diffraction spectra. Further, it can be confirmed that two RHEED patterns overlap in all the RHEED images.

Figure 11:
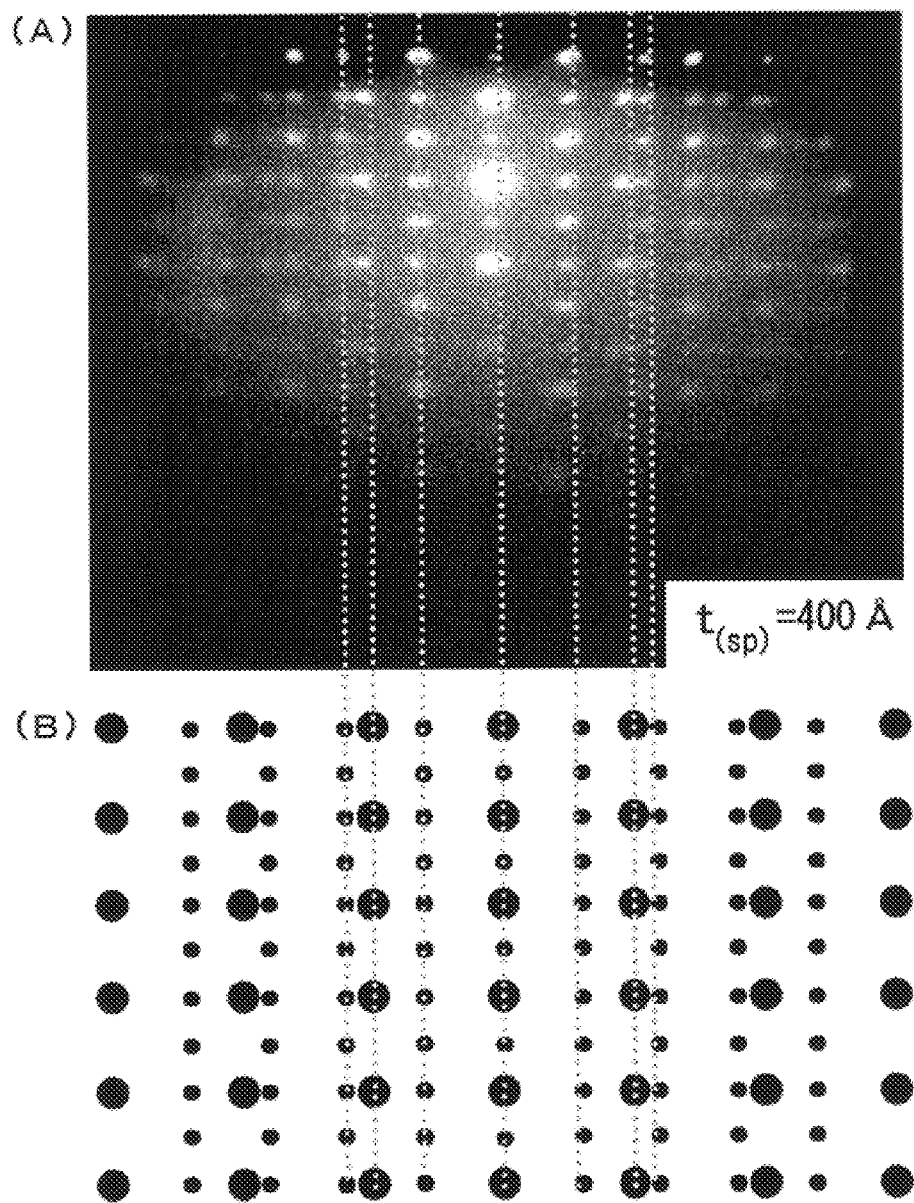
FIG. 11A is an actual image of the zinc oxide thin film taken by RHEED.
FIG. 11B is an image thereof created by calculation.

Next, in FIG. 11, the RHEED image of the specimen in which the thickness of the ZnO buffer layer formed by sputtering is set to 400 Å (refer to FIG. 11A) and the REED image of a similar specimen obtained by calculation (refer to FIG. 11B) will be examined in comparison with each other. FIG. 11B is the RHEED image of the hexagonal prism crystal of wurtzite of ZnO obtained by calculation when electron beams are incident thereon from [1120] and [1010] directions. As shown in FIGS. 11A and 11B, it can be found that the RHEED image obtained as a result of calculation is in very good agreement with the RHEED image of the above specimen.

Figure 12:
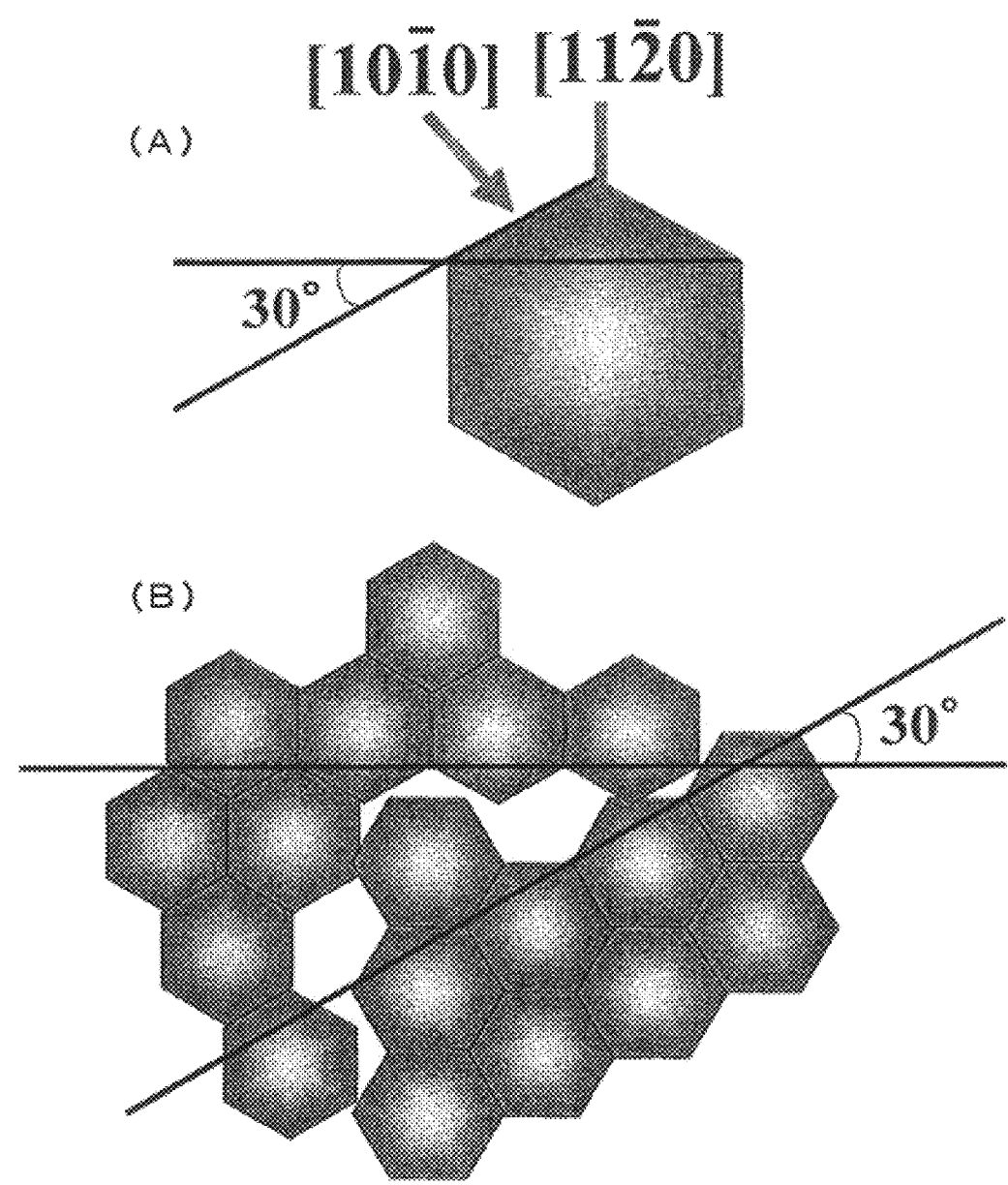
FIGS. 12A and 12B are views showing a crystal(s) in the zinc oxide thin film on a silicon substrate.

It can be assumed from the above result that the above specimen has a bicrystal structure in which the hexagonal prism crystals of ZnO rotating at 30° in an in-plane direction are mixed as shown by the model of FIG. 12A. A reason why this structure is generated is conceived as described below. That is, hexagons are formed by combining each six pieces of triangles of the lattice structure of a Si (111) surface, and a ZnO (002) surface is grown epitaxially on the lattice structure. However, the ZnO thin film on the Si surface rotates 30° because the lattice structure cannot be perfectly traced between the silicon substrate and the ZnO buffer layer (refer to FIG. 12(B)). While it is needless to say that a single crystal ZnO thin film is most suitable as a semiconductor member, it lowers the reproducibility of a thin film structure to form a single crystal ZnO thin film over an entire region. The present invention has achieved the reproducibility of a method of forming a ZnO thin film by slightly scarifying the characteristics of the semiconductor member.

Figure 13:
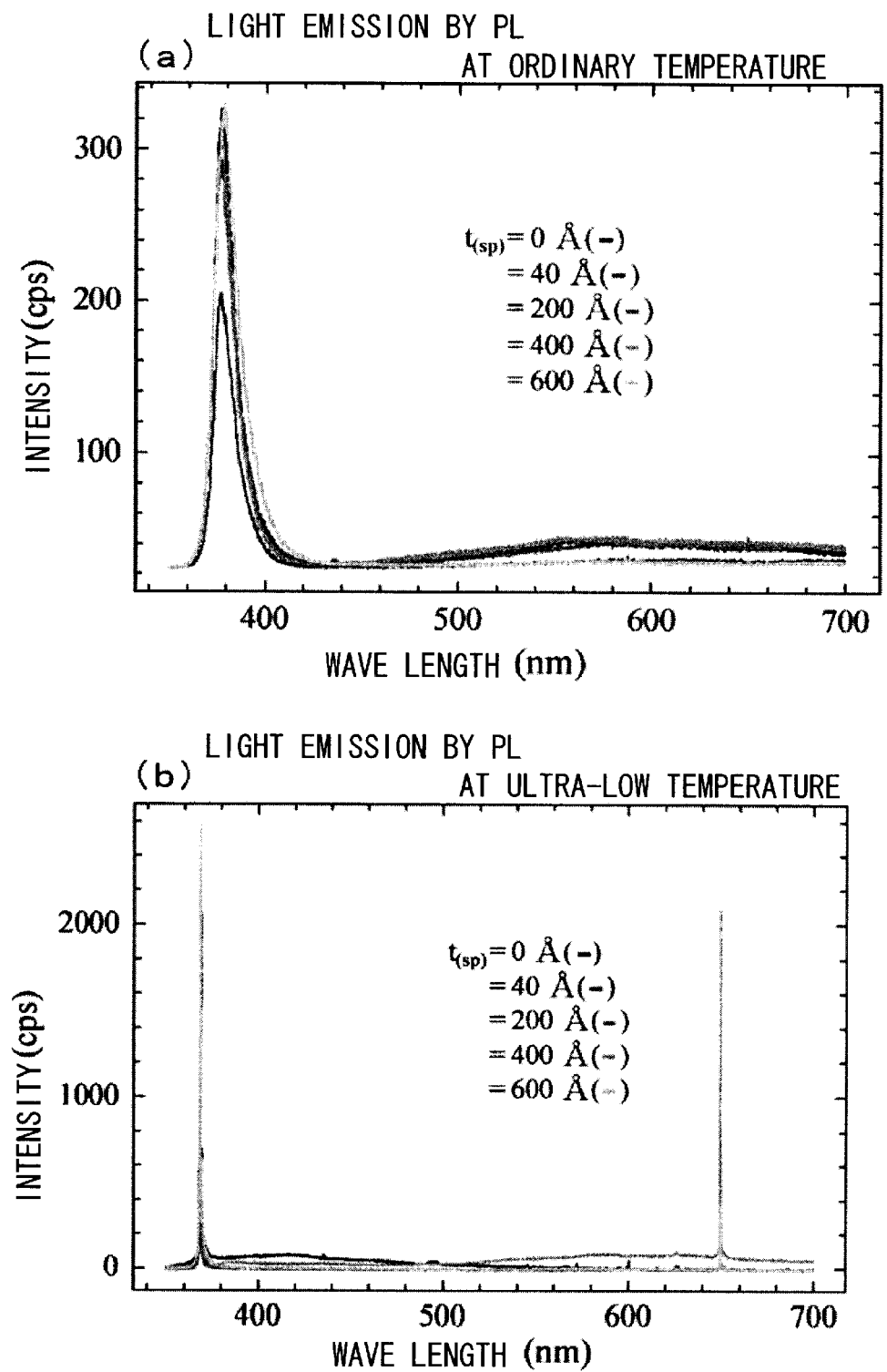
FIG. 13A and 13B are graphs showing the photoluminescence (PL) characteristics of a zinc oxide thin film.

Next, FIGS. 13A and 13B shows the photoluminescence (PL) characteristics of the resultant thin film. FIG. 13A shows a result of measurement at an ordinary temperature, and FIG. 13B shows a result of measurement at an ultra-low temperature of 4.2 k. These figures show the results of measurement in which the film thickness of the ZnO buffer layers formed by sputtering was changed from 0 Å to 600 Å in an overlapping state. These photoluminescence (PL) characteristics can be preferably used to evaluate the semiconductor member when it is used as a light emitting element. In addition to the above, these characteristics can predict the existence of a level in a forbidden band, and the like due to the mixture of impurities, reduced crystallinity and the offset of a composition. In particular, the level at an end of the forbidden band can be analyzed in detail by the result of measurement at the very low temperature. Light emission corresponding to the forbidden band width in the vicinity of 380 nm can be confirmed from FIG. 13A in all the specimens in which the film thickness of the ZnO buffer layer formed by sputtering was changed. Light emission from a very sharp forbidden band width can be confirmed from FIG. 13B. It is apparent from these results that any level due to impurities and defects exists in the forbidden band.

Finally, an X-ray diffraction spectrum analysis was performed to obtain the additive characteristics of Ga when it is added as an n-type impurity.

Figure 8:
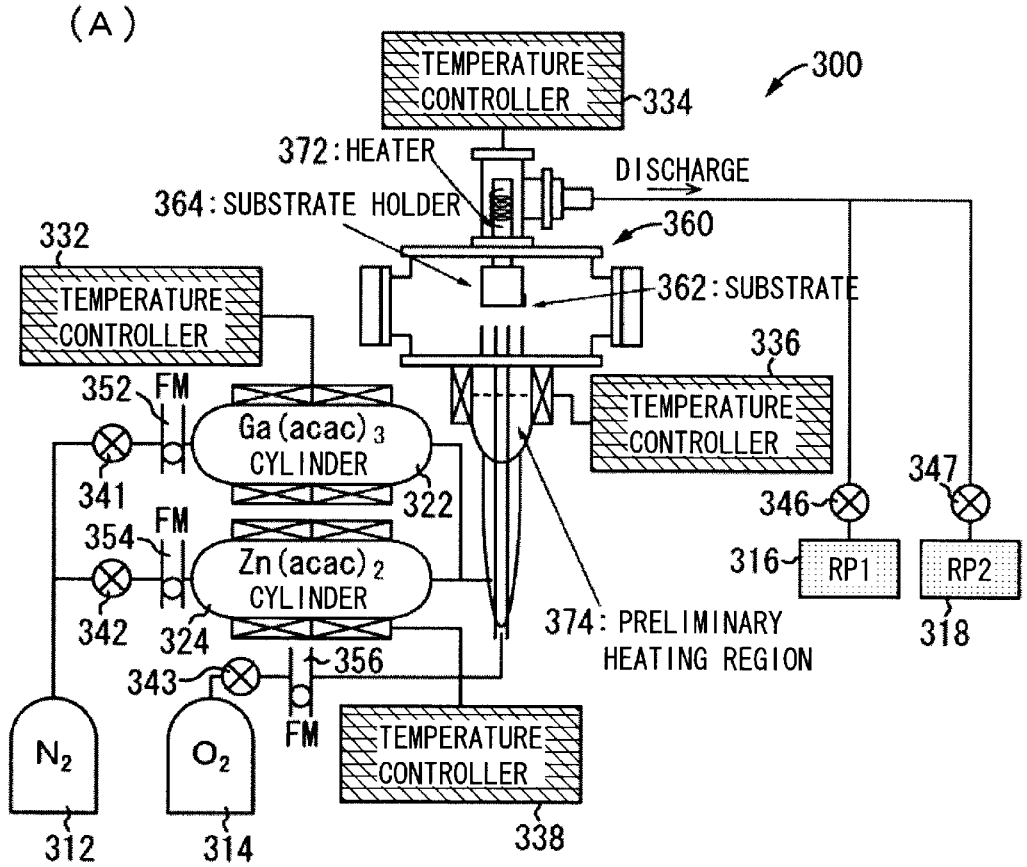
FIG. 8A is a schematic view showing a pressure-reduced metal-organic chemical vapor deposition (MO-CVD) used to form a ZnO thin film.
FIG. 8B is a table showing an example of conditions under which the ZnO thin film is formed.
Figure 14:
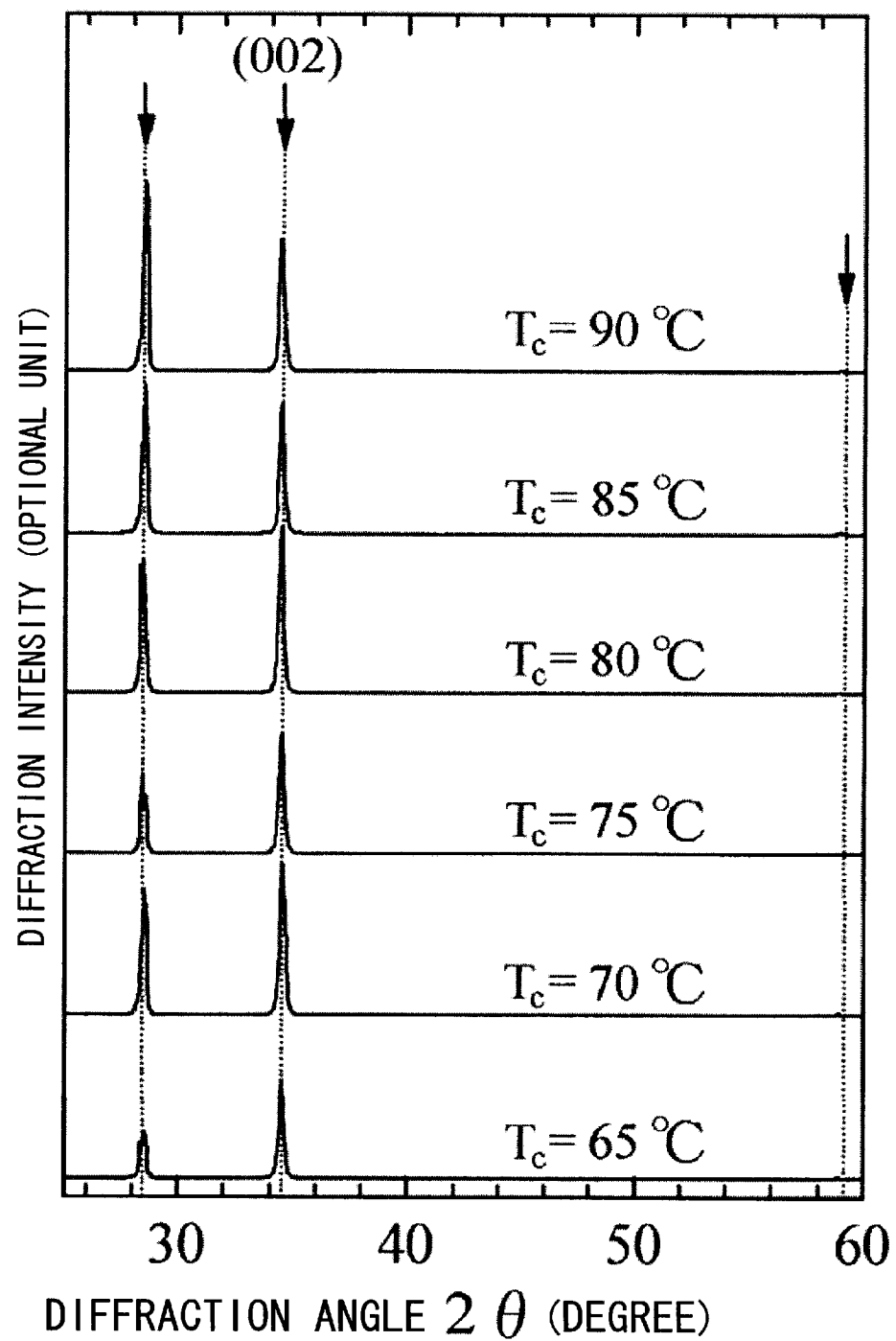
FIG. 14 is a view showing the X-ray diffraction spectra of a zinc oxide thin film when the concentration of Ga is changed.

In the pressure-reduced metal-organic chemical vapor deposition apparatus shown in FIG. 8, the amount of addition of Ga is controlled by controlling the sublimation temperature of an acetylacetone Ga material. FIG. 14 shows the X-ray diffraction spectra of specimens in which a Ga cylinder temperature was changed. The film thickness of the ZnO buffer layers formed by sputtering was set to 400 Å. The respective X-ray diffraction spectra of the specimens were obtained by changing the Ga cylinder temperature Tc from 65° C. to 90° C. It is apparent that the diffraction intensity of ZnO (002) was not almost changed by the Ga cylinder temperature Tc. Similarly, no change of RHEED images is observed from the measurement by RHEED.

Next, the electric characteristics of the specimens to which Ga was added were measured. However, the electric characteristics of a silicon substrate itself are reflected to the measurement of a ZnO thin film formed thereon. To cope with this problem, an amorphous Pyrex glass substrate and a single crystal sapphire substrate were introduced into the same apparatus in which the silicon substrate was disposed, and ZnO thin films were deposited simultaneously on these three substrates. Then, the additive characteristics of the n-type impurity was predicted using the results of disposition of the ZnO thin films on the Pyrex glass substrate and the single crystal sapphire substrate as a reference. When crystallinity and the like are taken into consideration, it is contemplated that the electric characteristics of the ZnO thin film deposited on the silicon substrate have a value intermediate between the value of the ZnO thin film on the Pyrex glass and the value of the ZnO thin film on the single crystal sapphire substrate.

Figure 15:
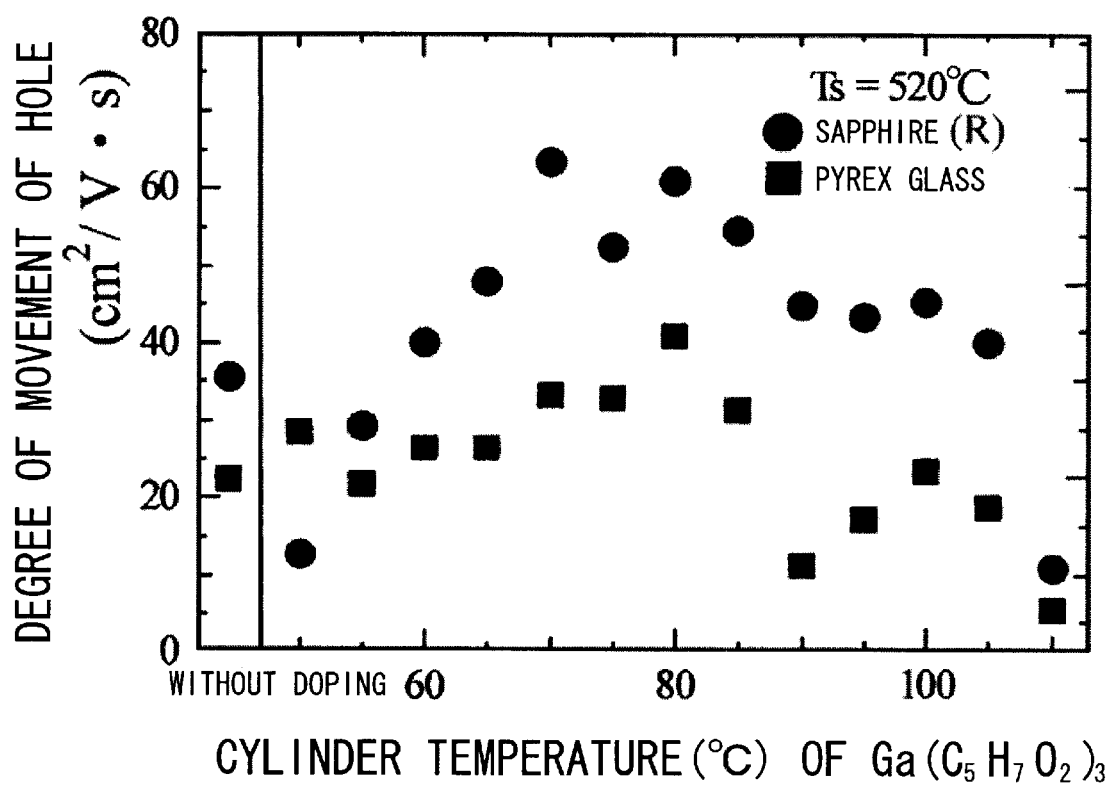
FIG. 15 is a graph showing the degree of movement of hole in a zinc oxide thin film when the concentration of Ga is changed.
Figure 16:
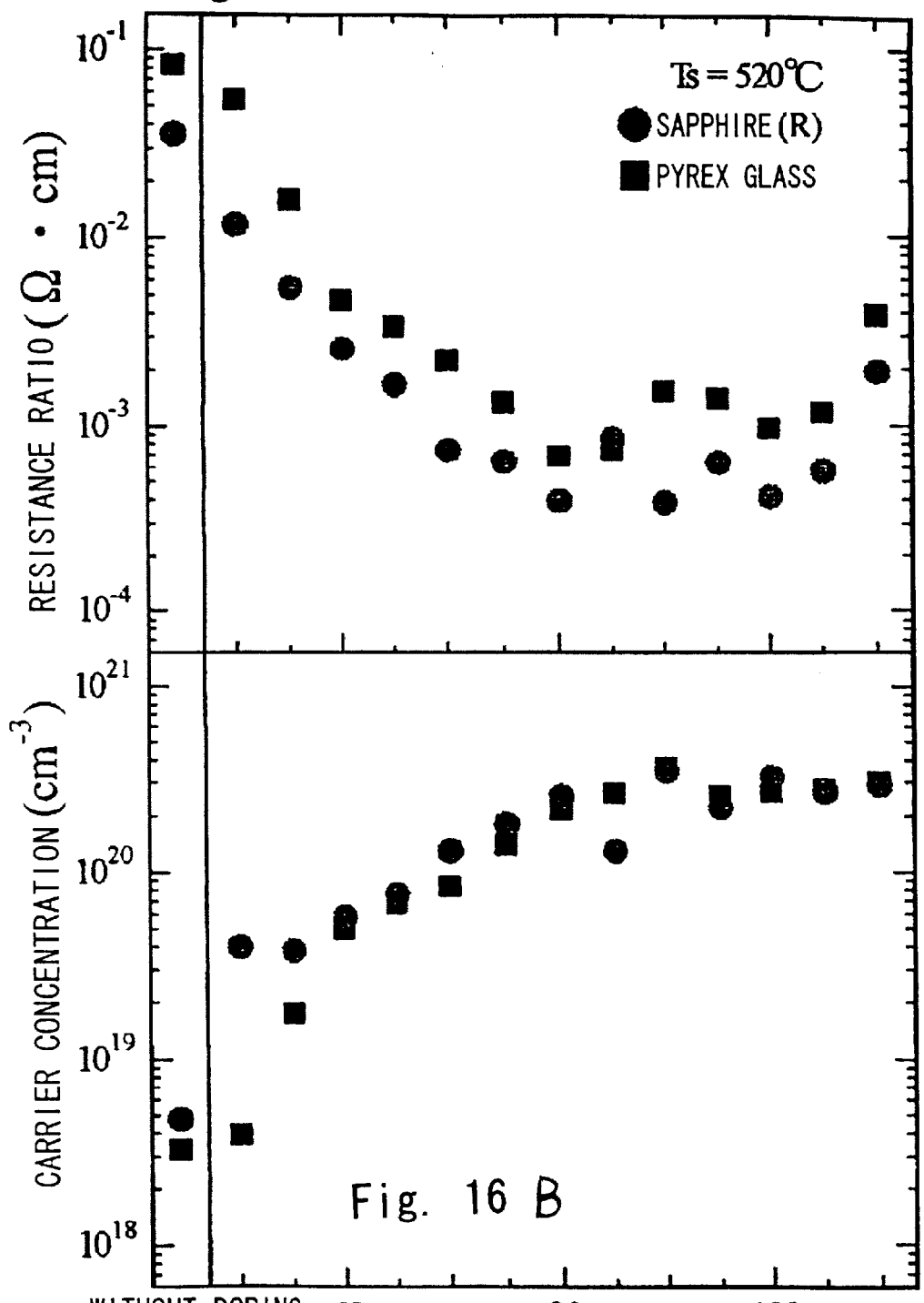
FIG. 16A is a graph showing the concentration of a carrier and FIG. 16B is a graph showing a resistance ratio, in a zinc oxide thin film when the concentration of Ga is changed.

FIG. 15 shows the degrees of movement of hole of the single crystal sapphire and the amorphous Pyrex glass substrate, and FIG. 16 shows the carrier concentrations and the resistance ratios thereof. The maximum degrees of movement of hole of the single crystal sapphire and the amorphous Pyrex glass substrate shown in FIG. 15 have very large values of 65 to 40 cm$^2$/V·sec.

Further, the resistance ratios shown in FIG. 16A is within the range of $3 \times 10^{-4}$ to $6 \times 10^{-4}$ Ω·cm at the minimum which is considerably smaller than the result of a conventional ZnO thin film. As described above, the additive characteristics of the n-type impurity exhibits the very excellent values.

FIG. 17 shows a band view of a pn-junction device in which an n-type ZnO thin film obtained by the above forming method is combined with a p-type silicon substrate. In FIG. 17B showing a state just after pn-junction, a barrier is generated on the filled band side of the band view to cause Fermi levels to be in agreement with each other. FIG. 17C shows a state of the band view after forward bias is applied. When the pn-junction device is functioned as a current injection type light emitting element, it emits light in the region where a forbidden band width changes. Therefore, the wavelength of emitted light is changed to a long wavelength side by changing an electric field. This element has interesting characteristics that the wavelength of emitted light is changed by the change of an electric field and can be applied to various fields.

Further, the pn-junction device can be used in an application in which the wavelength of emitted light is fixed by inserting a thin film layer having a large forbidden band width into the interface of the pn-junction thereof. This thin film layer is defined as a hole injection layer. It is preferable to use polycrystal oxide, single crystal oxide, and the like as the material of this layer. Further, a thin film having a lattice constant which is intermediate between the lattice constant of the silicon substrate and that of the ZnO thin film is preferably used because it exists on the interface therebetween. It is preferable that the conduction type of this thin film be a P-type in view of the hole insertion. It is not necessary, however, to take the conduction type into consideration when the thin film is an ultra-thin film of several tens of angstroms by which tunneling is caused. Materials such as $Al_2O_3$, $MgAlO_3$, MgO, and the like can be selected as the material of the hole injection layer.

Figure 18:
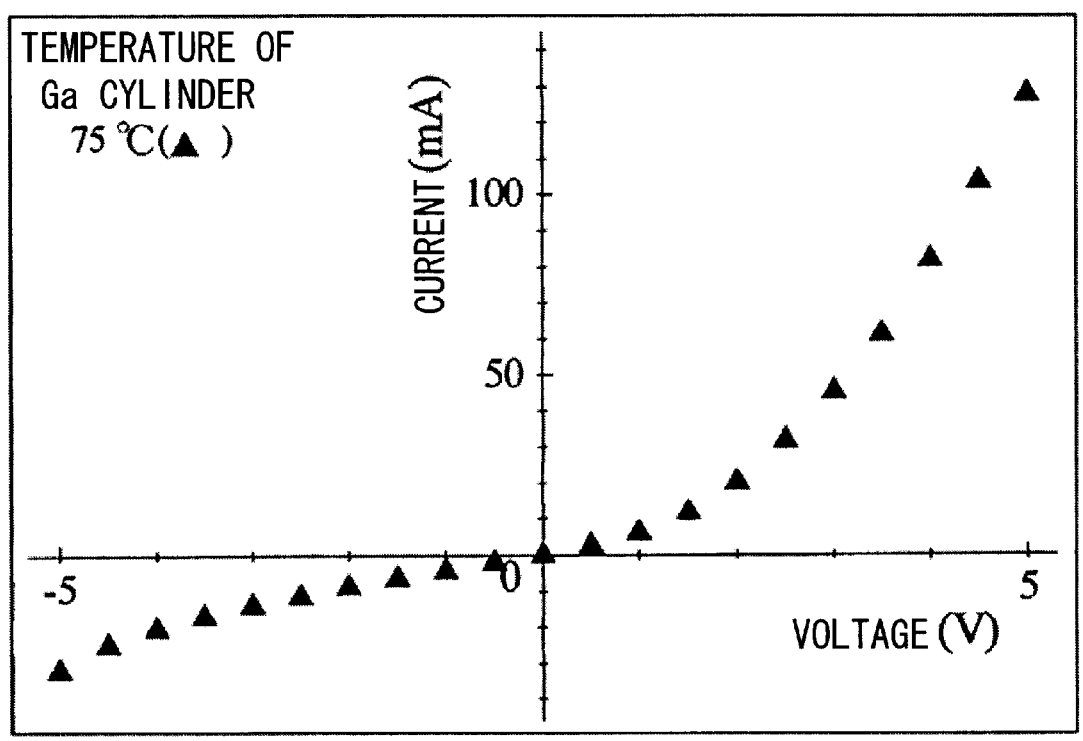
FIG. 18 is a graph showing the current/voltage characteristics of the pn-junction device formed by combining the n-type ZnO thin film with the p-type silicon substrate.

Electric Characteristics of Diode Composed of Zinc Oxide Thin Film Formed on Silicon Substrate FIG. 18 shows the current/voltage characteristics of a pn-junction device made by combining an n-type ZnO thin film obtained by the above method and a p-type silicon substrate. The pn-junction of the device was made by forming an n-type zinc oxide into which gallium was injected (gallium concentration: about $2 \times 10^{20}$ cm$^{-3}$) on a commercially available boron-injected low resistance p-type silicon substrate (resistance ratio: 0.1 Ω·cm or less). In FIG. 18, excellent rectifying property can be confirmed, while a slight amount of leakage of current is admitted in reverse bias. When a forward bias voltage of 5 V was applied to this device, a current of 135 mA flew, and it could be confirmed that bluish green light emitted from the surface of the device. When the voltage applied to the device was more increased, a current of 450 mA flew at 10 V and the color of the emitted light changed to vermilion. It is conceived that the color of the emitted light was changed by the application of a different electric field because the forbidden band width of a pn-junction interface changed.

Spectral Sensitivity Characteristics of Diode

Figure 19:
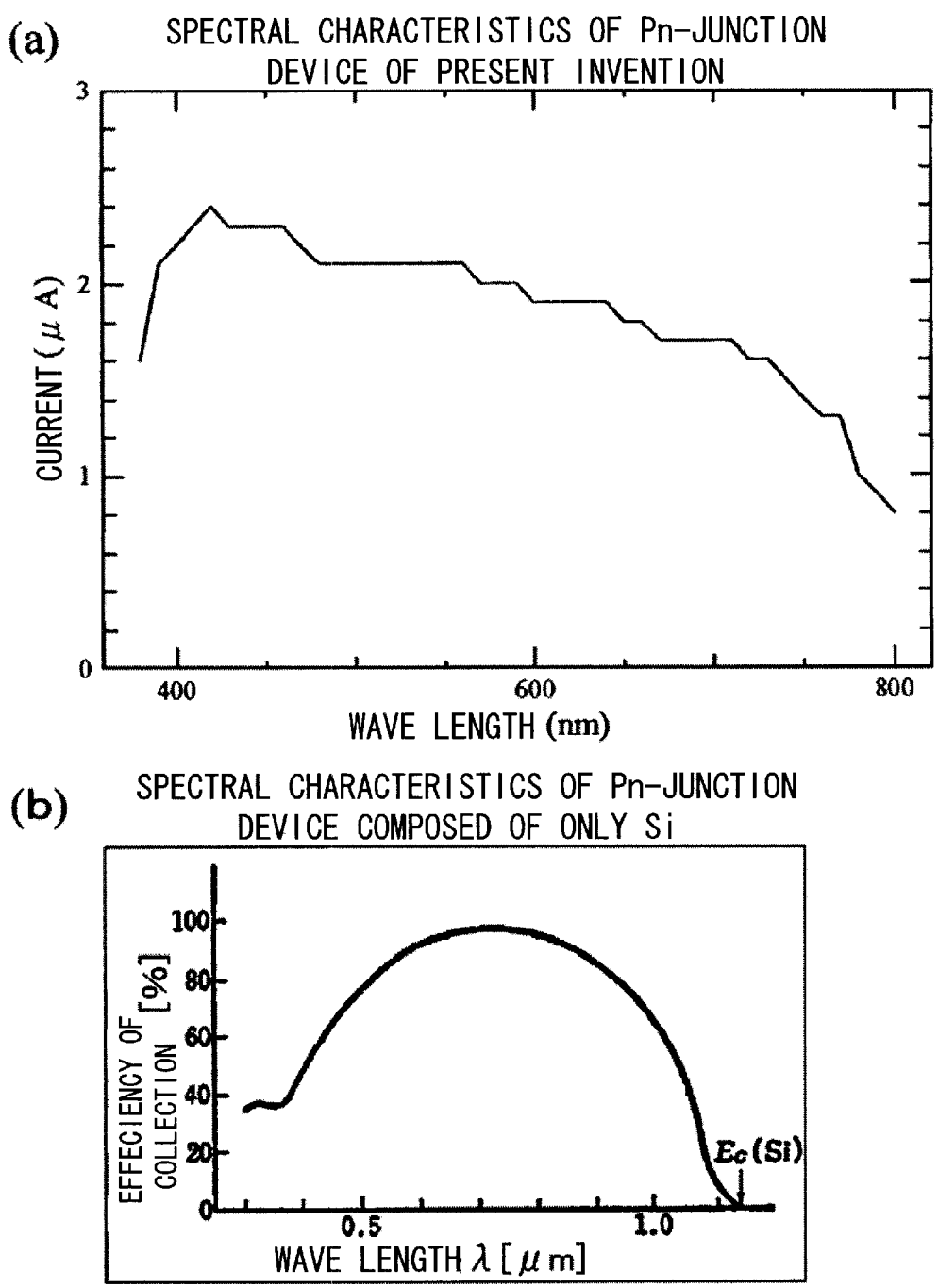
FIG. 19A is a graph showing the spectral characteristics of the pn-junction device formed by combining the n-type ZnO thin film with the p-type silicon substrate when the spectral characteristics were measured by applying monochromatic light in a predetermined amount and changing the wavelength of the monochromatic light from 380 nm to 800 nm.
FIG. 19B is a graph when the spectral characteristics of the pn-junction of only the silicon are measured.

An ammeter was connected to the pn-junction device obtained by combining the n-type ZnO thin film with the p-type silicon substrate, a predetermined amount of monochromatic color was applied to the device, and the spectral sensitivity characteristics of the device were measured by changing the wavelength of the monochromatic color from 380 nm to 800 nm. FIG. 19A shows the result of measurement. FIG. 19B shows the spectral sensitivity characteristics of only a silicon material for comparison. It is apparent from the comparison of them that the spectral, sensitivity characteristics of FIG. 19A is obtained by adding the spectral sensitivity characteristics of the ZnO thin film to those of the silicon substrate.

Note that it is needless to say that a light receiving element using the pn-junction can be applied to not only a light sensor but also to a solar battery, and the like.

As described above, according to the present invention, a polycrystal zinc oxide semiconductor member which is excellent in crystallinity and composition can be formed on a silicon substrate. Then, a pn-junction device that makes use of a p-type silicon substrate an n-type ZnO thin film is obtained by adding an n-type impurity to a thin film having been formed, whereby a light emitting element and a receiving element also can be formed.

What is claimed is:

1. A zinc oxide semiconductor member comprising:
 a zinc oxide thin film formed on a substrate having a single crystal silicon (111) surface wherein the crystal orientation of the surface of the zinc oxide thin film exhibits the c-axis orientation surface of a wurtzite structure and further includes a zinc oxide buffer layer wherein the photoluminescence spectrum when He—Cd laser (325 nm) is irradiated to the zinc oxide thin film emits light in the vicinity of a forbidden bandwidth in the vicinity of 387 nm.

2. A zinc oxide semiconductor member comprising:
 a zinc oxide thin film formed on a substrate having a single crystal silicon (111) surface wherein the crystal orientation of the surface of the zinc oxide thin film exhibits the c-axis orientation surface of a wurtzite structure and wherein photoluminescence spectrum when He—Cd laser (325 nm) is irradiated to the zinc oxide thin film emits light in the vicinity of a forbidden bandwidth in the vicinity of 387 nm and further comprising hydrogen bonded to the surface of the single crystal silicon (111) surface by a hydrogen fluoride treatment, a buffer layer formed on the substrate by depositing zinc oxide thereon by sputtering, and a zinc oxide thin film formed on the buffer layer by depositing zinc oxide thereon by chemical vapor deposition using acetyl acetone zinc.

3. The zinc oxide semiconductor member of claim 1 further comprising hydrogen bonded to the surface of the single crystal silicon (111) surface by a hydrogen fluoride treatment, the buffer layer formed on the substrate by depositing zinc oxide thereon by sputtering, a zinc oxide thin film formed on the buffer layer by depositing zinc oxide thereon by chemical vapor deposition using acetyl acetone zinc and wherein the crystal surface on the buffer layer rotates 30°.

4. A pn-junction light receiving element using the zinc oxide semiconductor member of claim 1 wherein the pn-junction device is constructed by arranging the silicon substrate as a p-type and the zinc oxide thin film as an n-type, whereby the spectral sensitivity of the pn-junction device is higher in a near violet region than in a visible light region.

5. A pn-junction light receiving element using the zinc oxide semiconductor member of claim 2 wherein the pn-junction device is constructed by arranging the silicon substrate as a p-type and the zinc oxide thin film as an n-type, whereby the spectral sensitivity of the pn-junction device is higher in a near violet region than in a visible light region.

6. A pn-junction light receiving element using the zinc oxide semiconductor member of claim 3 wherein the pn-junction device is constructed by arranging the silicon substrate as a p-type and the zinc oxide thin film as an n-type, whereby the spectral sensitivity of the pn-junction device is higher in a near violet region than in a visible light region.

7. A pn-junction light emitting element using the zinc oxide semiconductor member of claim 1 wherein the pn-junction device is constructed by arranging the silicon substrate as a p-type and the zinc oxide thin film as an n-type and wherein a hole insertion layer is inserted into the interface of the junction between the p-type silicon substrate and the n-type zinc thin film.

8. A pn-junction light emitting element using the zinc oxide semiconductor member of claim 2 wherein the pn-junction device is constructed by arranging the silicon substrate as a p-type and the zinc oxide thin film as an n-type and wherein a hole insertion layer is inserted into the interface of the junction between the p-type silicon substrate and the n-type zinc thin film.

9. A pn-junction light emitting element using the zinc oxide semiconductor member of claim 3 wherein the pn-junction device is constructed by arranging the silicon substrate as a p-type and the zinc oxide thin film as an n-type and wherein a hole insertion layer is inserted into the interface of the junction between the p-type silicon substrate and the n-type zinc thin film.

* * * * *